United States Patent [19]

Karpman

[11] Patent Number: 5,117,279
[45] Date of Patent: May 26, 1992

[54] SEMICONDUCTOR DEVICE HAVING A LOW TEMPERATURE UV-CURED EPOXY SEAL

[75] Inventor: Maurice S. Karpman, Austin, Tex.
[73] Assignee: Motorola, Inc., Schaumburg, Ill.
[21] Appl. No.: 498,156
[22] Filed: Mar. 23, 1990
[51] Int. Cl.$^5$ .............. H01L 23/28; H01L 23/02; H01L 23/12
[52] U.S. Cl. .............. 357/72; 357/74; 357/80; 357/65
[58] Field of Search .............. 357/7, 8, 72, 65, 74, 357/80

[56] References Cited

U.S. PATENT DOCUMENTS

| | | | |
|---|---|---|---|
| 4,141,055 | 2/1979 | Berry et al. | 357/80 |
| 4,480,009 | 10/1984 | Berger | 357/7 |
| 4,783,697 | 11/1988 | Benenati et al. | 357/65 |

Primary Examiner—Andrew J. James
Assistant Examiner—Carl Whitehead, Jr.
Attorney, Agent, or Firm—Jasper W. Dockrey

[57] ABSTRACT

A semiconductor device having a package sealed by a UV-curable, thixotropic, acrylated epoxy and a method for sealing the package are disclosed. The package is sealed at room temperature by polymer cross-linking of the epoxy which is initiated by exposure of at least a portion of the expoxy to ultraviolet (UV) frequency radiation. In accordance with one embodiment of the invention, a base is provided having an electronic component attached to the base at a predetermined location. A lid having a layer of UV-curable epoxy screen-printed to a bonding portion is positioned onto the base enclosing the electronic component within a cavity formed by the union of the base and the lid. The lid is sealed to the base at room temperature by irradiating an exposed edge portion of the epoxy layer with UV frequency radiation. The formation of the seal at room temperature avoids thermal damage to temperature sensitive materials in both the package and the enclosed electronic component.

3 Claims, 2 Drawing Sheets

SEMICONDUCTOR DEVICE HAVING A LOW TEMPERATURE UV-CURED EPOXY SEAL

BACKGROUND OF THE INVENTION

This invention relates to semiconductor devices and more particularly to semiconductor devices having an electronic component sealed within a package.

In the assembly of semiconductor devices, such as an integrated circuit (IC) device, or the like it is desirable to avoid exposing the devices to excessive heat that may cause damage to certain materials present in the device. Conventional materials and assembly processes used to form hermetic package seals often require high temperature process steps. For example, high temperature steps are often used to form a hermetic glass seal between the base and the lid of the package housing an electronic component. The glass sealing process is typically performed at temperatures ranging from about 400 to 500 degrees centigrade and heating times of about 1 to 2 hours. In this time and temperature range many glass materials begin to exhibit flow characteristics, which is necessary to form a glass seal, but the high temperature sealing process can also cause oxidation of many metals used to form package leads. For example, copper and aluminum must be plated with a non-readily oxidizable material such as nickel to prevent the formation of oxide scales on the lead surface. Additionally, the glass sealing process can cause cracking of the passivation layers overlying the circuit components of the IC device. Once the passivation layer has been compromised, the protection of the circuit elements against moisture and contamination has been lost and a potential for premature failure of the IC device exists.

The need to produce more reliable semiconductor devices has led to the development of assembly processes using low temperature sealing materials. Both thermoplastic materials and thermosetting polymers, such as epoxy resins, have been developed for use as sealant materials to enclose an IC device within a package body. Thermal epoxies that can be cured at temperatures between 150 and 200 degrees centigrade have been developed. The thermal epoxy curing process initiates cross-linking of low-molecular-weight polymer chains forming high molecular weight interlinked polymer units.

The use of epoxy sealant materials offers several advantages to semiconductor device manufactures and can be used for low temperature sealing of ceramic packages such as pin-grid-arrays (pgAs) and ceramic-quad-flat-packs (CQFPs). An low temperature epoxy sealant has potential to offer a highly reliable sealant in applications where a totally hermetic seal is not required. However, it has been observed that thermal epoxy materials can suffer defects during processing even at relatively moderate sealing temperatures.

In an assembly process using a thermal epoxy, a layer of epoxy is screened onto a ceramic base then partially cured using a heat cycle of short duration to partially bond the epoxy to the lid. This step is known in the art as B-stage processing. A ceramic lid is then clamped onto the base and the assembly is heated to drive of solvents present in the epoxy and to form polymer cross-links in the epoxy film. Typically, the base and the lid are configured such that when they are brought together a cavity is formed in the interior of the package. The cured epoxy forms a seal between the lid and the base enclosing the IC device within the cavity. This process has the advantage of producing a seal at a lower temperature than that used to form a glass seal; however, the process is sensitive to pressure differentials between the cavity and the ambient environment. During the curing process, air trapped inside the cavity can expand and escape the confines of the cavity through the curing epoxy film. The air traversing the thermal epoxy film creates holes or voids in the epoxy resulting in the formation of a structurally weak seal that is prone to rupturing. A similar problem can be encountered if the assembly is cooled too rapidly after curing the epoxy. With rapid cooling the air pressure inside the cavity can momentarily drop below that of the outside ambient and air can flow into the cavity through the warm epoxy film forming voids in the film. The benefit of using a thermal epoxy as a seal material can thus be compromised by a pressure differential forcing air through the epoxy as the film is cured.

The thermal epoxies overcome some of the problems of glass seals, but are themselves prone to seal integrity problems. Accordingly, a need existed for a semiconductor device having a package seal material capable of forming a seal at room temperature which overcomes the problems associated with high temperature glass seals and with epoxy seals, and a process for fabricating the same.

BRIEF SUMMARY OF THE INVENTION

An object of the invention is to provide an improved semiconductor device having a protective seal free from temperature and pressure induced defects.

Another object of the invention is to provide an improved semiconductor device having a package sealed at room temperature.

Yet another object of the invention is to provide an improved semiconductor device having an oxide free copper leadframe.

A further object of the invention is to provide a room temperature sealing process for the assembly of a semiconductor device.

These and other objects and advantages of the invention are achieved by a semiconductor device having a package sealed with a UV-curable, thixotropic, acrylated epoxy. The package is sealed at room temperature by polymer cross-linking of the epoxy initiated by exposure of at least a portion of the epoxy to ultraviolet (UV) frequency radiation. In accordance with one embodiment of the invention, a base is provided having an electronic component attached to the base at a predetermined location. The electronic component is covered and sealed by at least one enclosure material wherein the at least one material is a UV-curable epoxy.

Figure 1:
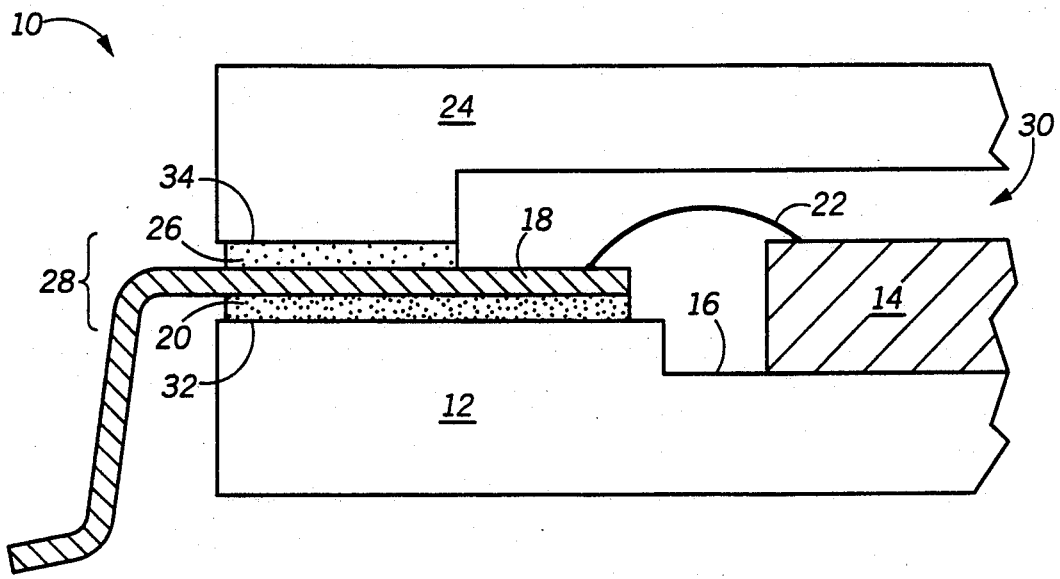
FIG. 1 is a partial cross sectional view of a semiconductor device in accordance with one embodiment of the invention.
Figure 2:
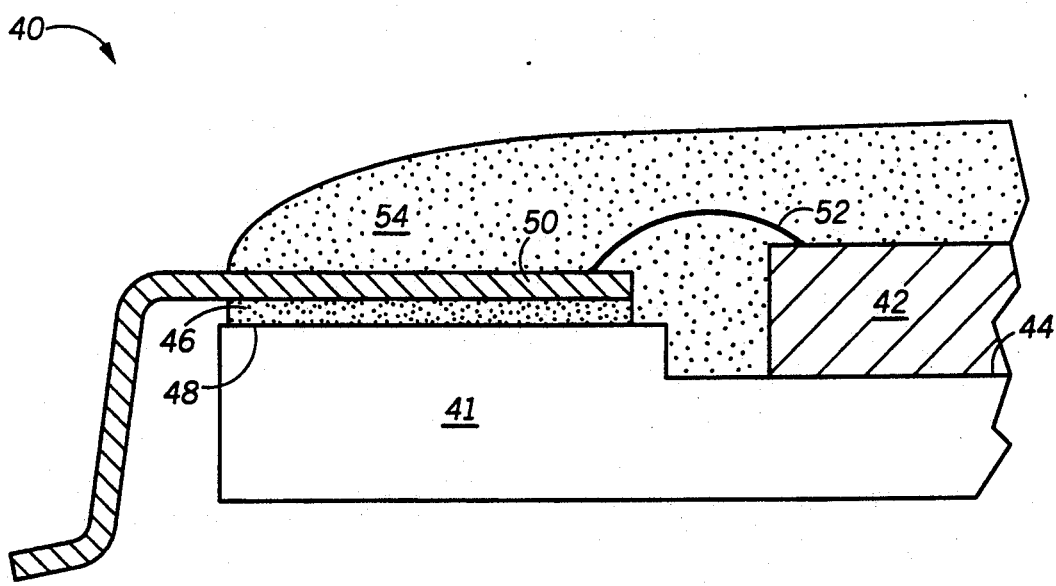
FIG. 2 is a partial cross sectional view of a semiconductor device in accordance with a further embodiment of the invention.

It will be appreciated that in FIGS. 1 and 2 the proportions of the various parts are not to scale. For example, the dimensions of some of the elements are exaggerated relative to each other for clarity.

DETAILED DESCRIPTION OF THE PREFERRED EMBODIMENTS

Shown in FIG. 1, in cross section, is a portion of a semiconductor device 10, in accordance with one embodiment of the invention, comprising a base 12 and an electronic component 14, such as an IC device, attached to a recessed bonding surface 16. A package lead 18 extends outwardly from electronic component 14 and is partially embedded in a first adhesive layer 20. Package lead 18 is connected to electronic component 14 by an device lead 22. A lid 24 covers electronic component 14 and is bonded to base 12 and portions of metal lead 18 by a second adhesive layer 26. First adhesive layer 20 and second adhesive layer 26 form a package seal 28. The union of lid 24 with base 12 forms a cavity 30 surrounding electronic component 14. Those skilled in the art will recognize the package structure illustrated in FIG. 1 as having the configuration of a quad-flat-pack (QFP). In the standard QFP package design, package leads, such as package lead 18, are numerous and extend outwardly from all four sides of the package. Package lead 18 is configured for surface mounting semiconductor device 10 onto a mounting substrate such as a printed circuit board. Alternatively, the package leads can be forged into other surface mounting compatible shapes such as J-lead or a butt-joint configuration, or the like.

In accordance with one embodiment of the invention, the construction of package seal 28 begins with the formation of first adhesive layer 20. A solution containing a thermal epoxy material, such as a novolak resin dissolved in a volatile organic solvent, is screened onto a lead mounting surface 32 at the perimeter of base 12. Alternatively, a thermoplastic resin material, such as polyimide or polyimide-siloxane, or the like, can be used. Base 12, having first adhesive layer 20 in place, is then transferred to a furnace and heated to partially thermally cure first adhesive layer 20. Following a cooling period, a leadframe having a plurality of package leads, such as package lead 18, is clamped to base 12 bringing the package leads into intimate contact with first adhesive layer 20. The assembly is then placed in a furnace and heated at a temperature between about 125 to 175 degrees centigrade for about 1 to 2 hours. The heat cycle cures the epoxy by driving off solvents present in the screened epoxy mixture and cross-linking polymer chains in the epoxy. As the thermal epoxy approaches its glass transition temperature, the clamping force partially embeds the leads in the epoxy compression bonding the leads in first adhesive layer 20.

After the package leads are partially embedded in first adhesive layer 20, electronic component 14 is bonded to bonding surface 16 with a bonding material such as a polyimide or a filled bonding epoxy, or the like. Electronic component 14 is then electrically coupled to package lead 18 by forming device lead 22. Device lead 22 is one of many such leads used to connect electronic component 14 to the package leads of semiconductor device 10. Electronic component 14 can be one of several types of electronic devices such as an integrated circuit device, a discrete device or a hybrid device, or the like. In addition, device lead 22 can be a wire bond or a tape-automated-bond (TAB) bond. In another embodiment of the invention electronic component 14 is mounted in a flip-chip configuration and bonded directly to the package leads. Although device lead 22 is depicted in the Figures as a wire bonded connection structure, it is intended that TAB and flip-chip methods of connection of electronic component 14 to package lead 18 be included within the scope of the invention.

According to the invention, the construction of package seal 28 continues with the formation of second adhesive layer 26 using an epoxy material that can be cured at room temperature by exposure to UV frequency radiation. A UV-curable acrylated epoxy, having a viscosity between about 20,000 to 60,000 centipoise, such as Westinghouse B-567 or B-5678-1 acrylated epoxy urethane compound, is screen printed onto a bonding portion 34 of lid 24. Lid 24 is then positioned onto base 12 and second adhesive layer 26 is brought into intimate contact with first adhesive layer 20 and package lead 18. In one embodiment of the invention, lid 24 is constructed from a material that is opaque to UV radiation, such as alumina, aluminum nitride, copper, aluminum or brass, or the like. The outer edge of package seal 28 is then irradiated with about 340 to 360 millijoules per square centimeter of UV radiation at an intensity of about 290 to 310 watts per square centimeter for about 2 to 10 seconds. The exact radiation exposure conditions are dependant upon the particular epoxy chosen. The UV radiation is directed to each side of the QFP and initially impinges on an outer edge of package seal 28 as will be subsequently described in the discussion of the sealing process. As the acrylated epoxy forming second adhesive layer 26 begins to cure, the polymer cross-linking process proceeds laterally toward cavity 30 until the entire seal area has been cured. The UV activated polymer cross-linking can continue to propagate laterally because as the epoxy cures it continues to transmit UV radiation. Thus, the UV radiation impinging on the outer edge of package seal 28 is not blocked by the previously cured epoxy on the outermost edge of package seal 28 and continues to laterally propagate through the acrylated epoxy. The characteristic of the cured acrylated epoxy to transmit UV radiation permits lid 24 to be clamped to base 14 prior to exposure to UV radiation. Semiconductor device 10 is then rotated so that all sides of the QFP package can be exposed to the UV radiation.

In another embodiment of the invention, lid 24 is constructed of a UV transparent material such as fused quartz, or unfilled or partially filled, polyphenylene sulfide plastic, or the like. The UV transparent nature of these materials allow the UV radiation to be directed to package seal 28 from a position directly above lid 24 on the opposite side of bonding portion 34. The use of a UV transparent material for the construction of lid 24 has the advantage of enabling the entire area of package seal 28 to be irradiated in a single operation. In this embodiment of the invention the QFP package can be sealed in one irradiation step thereby increasing the throughput of the sealing operation.

One skilled in the art will recognize that other types of packages may be sealed using the UV-curable acrylated epoxy of the invention. Shown in FIG. 2, in cross section, is a portion of a semiconductor device 40, in accordance with a further embodiment of the invention, comprising a base 41 having an IC device 42 attached to a recess surface portion 44. An adhesive layer 46, having a partially embedded package lead 50 therein, overlies a lead mount area 48. An inner lead 52 electrically couples IC device 42 with package lead 50. A body of UV-curable acrylated epoxy 54 overlies package lead 50 and covers inner lead 52 and IC device 42. Epoxy 54 forms a protective layer enclosing the environmentally sensitive elements of semiconductor device 40. In the process of assembling semiconductor device 40, after lead 50 has been embedded in adhesive layer 46 and IC device 42 has been attached to base 41, a layer of UV-curable acrylated epoxy, such as that previously described, is spread onto base 41. The thixotropic nature of epoxy material 54 causes the epoxy, when spread onto base 41, to flow in a conformal manner over base 41 such that the epoxy completely surrounds IC device 42 and inner leads 52. A protective seal is then formed upon exposure of epoxy material 54 to an amount of UV radiation sufficient to completely cure epoxy material 54.

The QFP package type shown in FIG. 2 is illustrative of a standard surface mountable package; however, the invention is not intended to be so limited and other types of packages, both surface mountable and through-hole mountable packages can be used. For example, lead 50 can be configured as a J-lead or a butt joint for surface mounting semiconductor device 40 to a mounting substrate. Furthermore, the present invention can be embodied in a standard dual-in-line package and package lead 50 configured for through-hole mounting of semiconductor device 40.

DESCRIPTION OF A PACKAGE SEALING PROCESS

Figure 3:
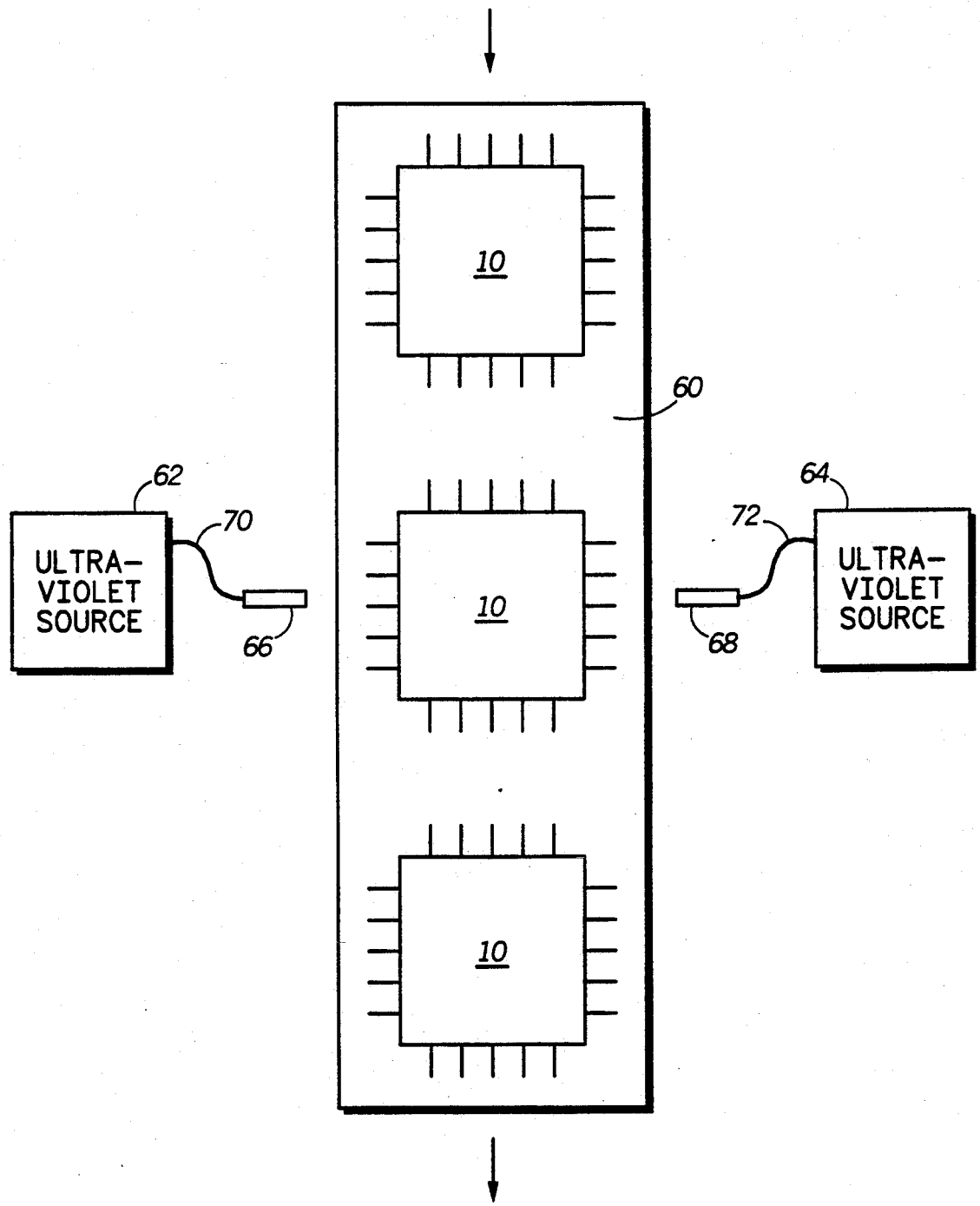
FIG. 3 schematically illustrates one embodiment of a package sealing process according to the invention.

One embodiment of a room temperature package sealing process, according to the present invention, is schematically illustrated in FIG. 3. A number of semiconductor devices 10 having lid 24 screen printed with a UV-curable epoxy to a thickness of about 5 milli-inches and clamped to a base 12 are placed on a carrier tray 60. Carrier tray 60 is then placed on a moving belt (not shown) and transported between two UV-source units 62 and 64. The belt transporting carrier tray 60 and UV-source units 62 and 64 operate in an ambient environment having a temperature of about 20 to 40 degrees centigrade. The arrows shown in FIG. 3 indicate the direction of movement of carrier tray 60 relative to UV-source units 62 and 64. UV-sources units 62 and 64 are equipped with directional probes 66 and 68 connected to UV-source units 62 and 64 by fiber optic cables 70 and 72 respectively. UV-source units are capable of delivering 100 to 400 watts per square centimeter of UV radiation having a wavelength ranging from 320 to 380 nanometers. During operation, the flux of UV radiation emitted by directional probes 66 and 68 impinges on the outwardly exposed edge portion of the UV-curable epoxy. The amount of UV radiation necessary to perform the package seal process is dependant upon interrelated process parameters. For example, the amount of UV radiation necessary to seal a given package is dependent upon the particular type and thickness of UV-curable epoxy screen printed onto each lid of semiconductor devices 10. The linear speed the belt transporting carrier tray 60 is then adjusted to allow the necessary UV-radiation dose to be delivered to each of semiconductor devices 10.

After initially transporting tray 60 past directional probes 66 and 68, the opposite sides of each of semiconductor devices 10 will have been sealed. At this point semiconductor devices 10 are rotated 90 degrees on carrier tray 60 and either again transported past UV-source units 62 and 68, or alternatively, transported past a second set UV radiation source units (not shown). It will be apparent to one skilled in the art that many variations of the process illustrated in FIG. 3 are possible. For example, semiconductor devices 10 can be vertically stacked in a rack and the rack can then be either raised or lowered through a UV-radiation field generated by four or more UV-source units, thus sealing the four sides of semiconductor devices 10 in one single UV exposure operation. Furthermore, a series of UV-reflective mirrors can be used to direct the UV-radiation from a single UV-source unit thereby exposing two or more sides of semiconductor devices 10 simultaneously.

An advantage of the present invention is that the package is sealed at room temperature thus avoiding damage to temperature sensitive materials present in the electronic component housed within the package, and the oxidation of metals within the package. Package sealing processes of the prior art have been carried out at temperatures ranging from 400 to 500 degrees centigrade in the case of glass sealing, and 150 to 200 degrees in the case of thermal epoxy sealing. At these temperatures many metals such as those used to construct package leads 18 and 50 can oxidize. Oxidation of metals used to fabricate the package leads is undesirable because even a slight amount of oxidation can render the lead non-solder wettable compromising the ability to attach the semiconductor device to a mounting substrate such as a printed circuit board. Furthermore, oxide scales formed on the metal surface can flake off causing electrical shorting between adjacent device leads. The ability to seal the package at room temperature, as provided by the present invention, permits the use of certain metals having low electrical resistance for the construction of package leads 18 and 50. Metals such as copper, for example, could not be used in processes of the prior art because of the formation of oxide scales on the copper surface during package sealing. The ability to form a package seal at room temperature, provided by the present invention, allows the use of copper package leads having a low electrical resistance. A semiconductor device having improved electrical performance that can be fabricated at a reduced cost is thus realized by the use of a UV-curable epoxy according to the present invention.

A further advantage of the present invention relates to the ability to maintain the same air pressure in the cavity as the ambient during the formation of the package seal. Sealing the package at room temperature avoids a pressure build up in the cavity removing the driving force that would cause air to flow through the epoxy film as it is cured. A strong seal of uniform density is thus obtained that is free of voids or air pockets.

Thus it is apparent that there has been provided, in accordance with the invention, a semiconductor device and process which fully meets the objects and advantages set forth above. Although particular embodiments of the invention have been described in the foregoing description, it will be apparent to one skilled in the art that numerous modifications and variations can be made to the presented embodiments which still fall within the spirit and scope of the invention. For example, the invention can be applied to semiconductor devices lacking outwardly extending exterior leads such as a lead-less-chip-carrier (LCC) or and other types of ceramic packages such as pgA or a ceramic dual-in-line package (DIP). Accordingly, it is intended that all such variations and modifications as fall within the scope of the appended claims and equivalents thereof be included within the invention.

I claim:

1. A semiconductor device comprising:
   a base having an integrated circuit attached to a recessed bonding surface thereon;
   an adhesive material overlying a lead mounting portion of the base;
   a plurality of metal package leads partially embedded in the adhesive material extending outwardly from the recessed bonding surface for electrically coupling the integrated circuit to a mounting substrate;
   a plurality of device leads electrically coupling the integrated circuit to the plurality of metal package leads;
   a lid overlying the base forming a cavity between the base and the lid enclosing the integrated circuit therein; and
   a layer of UV-curable epoxy overlying at least a portion of the plurality of metal package leads sealing the lid to the base.

2. The semiconductor device of claim 1 wherein the adhesive material is selected from the group consisting of thermal epoxy and polyimide.

3. The semiconductor device of claim 1 wherein the lid is constructed from a material selected from the group consisting of alumina, aluminum nitride, aluminum, copper and brass.

* * * * *